(12) United States Patent
Cha (10) Patent No.: US 9,589,628 B2
(45) Date of Patent: Mar. 7, 2017

(54) SEMICONDUCTOR DEVICE PERFORMING REFRESH OPERATION AND METHOD FOR DRIVING THE SAME

(71) Applicant: SK hynix Inc., Gyeonggi-do (KR)

(72) Inventor: Jae-Hoon Cha, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/732,318

(22) Filed: Jun. 5, 2015

(65) Prior Publication Data
US 2016/0225432 A1 Aug. 4, 2016

(30) Foreign Application Priority Data

Feb. 2, 2015 (KR) ........................ 10-2015-0015980

(51) Int. Cl.
| | | |
|---|---|---|
| G11C 11/406 | (2006.01) | |
| G11C 11/408 | (2006.01) | |
| G11C 7/02 | (2006.01) | |

(52) U.S. Cl.
CPC ............. *G11C 11/408* (2013.01); *G11C 7/02* (2013.01); *G11C 11/40615* (2013.01); *G11C 11/40618* (2013.01); *G11C 2211/4065* (2013.01); *G11C 2211/4068* (2013.01)

(58) Field of Classification Search
CPC .............................................. G11C 11/40611
USPC ........................................................ 365/222
See application file for complete search history.

(56) References Cited

U.S. PATENT DOCUMENTS

| | | | | |
|---|---|---|---|---|
| 7,095,670 B2* | 8/2006 | Lee | ...................... | G11C 7/1045 365/222 |
| 9,123,389 B1* | 9/2015 | Park | ...................... | G11C 11/406 |
| 2003/0067825 A1* | 4/2003 | Shimano | ............... | G11C 11/406 365/222 |
| 2008/0151670 A1* | 6/2008 | Kawakubo | ........... | G11C 7/1027 365/222 |
| 2009/0296510 A1* | 12/2009 | Lee | ...................... | G11C 11/406 365/222 |
| 2012/0051169 A1* | 3/2012 | Lee | ................... | G11C 11/40618 365/222 |
| 2012/0263003 A1* | 10/2012 | Sakakibara | ....... | G11C 11/40615 365/222 |

(Continued)

FOREIGN PATENT DOCUMENTS

KR 1020160045461 4/2016

*Primary Examiner* — Anthan Tran
*Assistant Examiner* — Mushfique Siddique
(74) *Attorney, Agent, or Firm* — IP & T Group LLP (57) ABSTRACT

A semiconductor device includes a first memory block, a second memory block, a first refresh control block for generating a first block control signal and a second block control signal in response to a refresh pulse signal, a second refresh control block for generating a first refresh control pulse signal and a second refresh control pulse signal corresponding to a first refresh operation section of the first memory block and a second refresh operation section of the second memory block, respectively, in response to the refresh pulse signal and the first and second block control signals, and a third refresh control block for controlling the first and second memory blocks so that a first refresh operation of the first memory block and a second refresh operation of the second memory block are discontinuously performed in response to the first and second refresh control pulse signals.

12 Claims, 4 Drawing Sheets

(56) References Cited

U.S. PATENT DOCUMENTS

| | | | |
|---|---|---|---|
| 2012/0307582 A1* | 12/2012 | Marumoto | G11C 11/40618 365/222 |
| 2013/0272082 A1* | 10/2013 | Kim | G11C 11/402 365/203 |
| 2013/0308405 A1* | 11/2013 | Jeong | G11C 7/00 365/222 |
| 2015/0206571 A1* | 7/2015 | Ko | G11C 11/40618 365/222 |
| 2015/0255140 A1* | 9/2015 | Song | G11C 11/406 365/222 |

* cited by examiner

SEMICONDUCTOR DEVICE PERFORMING REFRESH OPERATION AND METHOD FOR DRIVING THE SAME

CROSS-REFERENCE TO RELATED APPLICATIONS

The present application claims priority of Korean Patent Application No. 10-2015-0015980, filed on Feb. 2, 2015, which is incorporated herein by reference in its entirety.

BACKGROUND

1. Field

Exemplary embodiments of the present invention relate to a semiconductor design technology and, more particularly, to a semiconductor device which performs a refresh operation, and a method for driving the same.

2. Description of the Related Art

With the increase in integration of memories such as dynamic random access memory (DRAM), the space between word lines included therein has been reduced. With the reduction of space between word lines, the coupling effect between adjacent word lines has increased. Whenever data is written or read, a word line toggles between an active state and an inactive state. As the coupling effect between adjacent word lines increases, data of memory cells coupled to word lines adjacent to frequently activated word lines may be corrupted. This phenomenon is referred to as word line disturbance. Word line disturbance may cause data stored in memory cells to be lost before the memory cells are refreshed.

In order to alleviate this problem, a smart refresh technology has emerged. The smart refresh technology detects a target word line, which has been frequently activated, and refreshes memory cells coupled to word lines adjacent to the target word line. The smart refresh technology includes an additional refresh operation which is performed separately from the normal refresh operations, e.g., the auto-refresh operations.

However, when a semiconductor device operates as described above, the following issue may occur.

Refresh time, e.g., tRFC, which is a functional of the semiconductor device's design is defined in its specification. When the memory capacity of a semiconductor device increases, a refresh operation may not be completed within limited refresh time, e.g., tRFC. In other words, as the memory capacity increases, the margin of the refresh time, e.g., tRFC, decreases. Therefore, when the memory capacity of semiconductor devices is increased, a technology for securing the margin of the limited refresh time, e.g., tRFC, is required.

SUMMARY

Exemplary embodiments of the present invention are directed to a semiconductor device that may complete a refresh operation within a limited refresh time, and a method for driving the semiconductor device.

In accordance with an embodiment of the present invention, a semiconductor device includes a first memory block including a plurality of first memory units, a second memory block including a plurality of second memory units, a first refresh control block generating a first block control signal corresponding to the first memory block and a second block control signal corresponding to the second memory block in response to a refresh pulse signal, a second refresh control block generating a first refresh control pulse signal corresponding to a first refresh operation section of the first memory block and a second refresh control pulse signal corresponding to a second refresh operation section of the second memory block in response to the refresh pulse signal and the first and second block control signals; and a third refresh control block controlling the first and second memory blocks so that a first refresh operation of the first memory block and a second refresh operation of the second memory block are discontinuously performed in response to the first and second refresh control pulse signals.

Each of the first and second refresh operations may include a smart refresh operation.

The first refresh control block may alternately enable the first and second block control signals whenever the refresh pulse signal pulses a predetermined number of times.

The first refresh control block may include a counting unit counting a number of times that the refresh pulse signal pulses, and a block selection unit generating the first block control signal enabled during the first refresh operation section and the second block control signal enabled during the second refresh operation section in response to a counting signal generated from the counting unit.

The second refresh control block may include a first pulse generation unit generating a plurality of first control pulse signals in response to the refresh pulse signal, a first section limitation unit generating the first refresh control pulse signal in response to the first control pulse signals and the first block control signal, a second pulse generation unit generating a plurality of second control pulse signals in response to the refresh pulse signal, and a second section limitation unit generating the second refresh control pulse signal in response to the second control pulse signals and the second block control signal, wherein the first and second control pulse signals are sequentially enabled whenever the refresh pulse signal pulses.

The second refresh control block may further include a memory selection unit generating a memory selection signal for selecting the first and second memory units in response to a row control signal and a memory code signal.

The third refresh control block may include a signal process unit generating first and second address selection signals, an address variation control signal and a refresh combination pulse signal in response to the first and second block control signals and the first and second refresh control pulse signals, a first address latch unit storing a plurality of first target addresses corresponding to the first memory units, a first selection unit sequentially selecting the first target addresses as first selection addresses in response to the first address selection signal, a second address latch unit storing a plurality of second target addresses corresponding to the second memory units, a second selection unit sequentially selecting the second target addresses as second selection addresses in response to the second address selection signal, a third selection unit selectively outputting the first and second selection addresses as output addresses in response to the first and second block control signals, and an address variation unit generating a plurality of first and second neighboring addresses corresponding to the first target addresses and a plurality of third and fourth neighboring addresses corresponding to the second target addresses in response to the output addresses and the address variation control signal.

The first selection unit may output the first selection addresses corresponding to the first target addresses two times during the first refresh operation section, and the second selection unit may output the second selection addresses corresponding to the second target addresses two times during the second refresh operation section, and the third selection unit outputs the output addresses corresponding to the first and second selection addresses, respectively, during the first and second refresh operation sections.

The address variation unit may generate the first neighboring addresses that are decreased from the first target addresses and the second neighboring addresses that are increased from the first target addresses in response to the output addresses inputted two times during the first refresh operation section, and generate the third neighboring addresses that are decreased from the second target addresses and the fourth neighboring addresses that are increased from the second target addresses in response to the output addresses inputted two times during the second refresh operation section.

In accordance with another embodiment of the present invention, a method for driving a semiconductor device includes performing a first smart refresh operation of a first memory block during a first smart refresh operation section subsequent to a first auto refresh operation section, and performing a second smart refresh operation of a second memory block during a second smart refresh operation section subsequent to a second auto refresh operation section.

The first auto refresh operation section, the first smart refresh operation section, the second auto refresh operation section, and the second smart refresh operation section may be defined based on a number of times that a refresh pulse signal pulses.

The performing of the first smart refresh operation of the first memory block may include counting a number of times that the refresh pulse signal pulses, generating first and second neighboring addresses corresponding to a first target address of the first memory block when the number of times that the refresh pulse signal pulses is counted a first predetermined number of times, and enabling first and second word lines corresponding to the first and second neighboring addresses.

The generating of the first and second neighboring addresses may include reading the first target address, which is stored in advance, two times during the first smart refresh operation section, and generating the first neighboring address that is decreased from the first target address read firstly and the second neighboring address that is increased from the first target address read secondly.

The performing of the second smart refresh operation of the second memory block may include counting the number of times that the refresh pulse signal pulses, generating third and fourth neighboring addresses corresponding to a second target address of the second memory block when the number of times that the refresh pulse signal pulses is counted is equal to a second predetermined number of times, and enabling third and fourth word lines corresponding to the third and fourth neighboring addresses.

The generating of the third and fourth neighboring addresses may include reading the second target address, which is stored in advance, two times during the second smart refresh operation section, and generating the third neighboring address that is decreased from the second target address read firstly and the fourth neighboring address that is increased from the second target address read secondly.

In accordance with a further embodiment of the present invention, a semiconductor device includes a first memory block including a plurality of first memory units, a second memory block including a plurality of second memory units, and a first refresh control block setting first and second refresh operation sections of the first and second memory blocks by generating first and second block control signals, respectively, in response to a refresh pulse signal, wherein the first and second block control signals are alternately enabled whenever the refresh pulse signal pulses a predetermined number of times.

The semiconductor device may further include a second refresh control block generating a first refresh control pulse signal pulsing in the first refresh operation section and a second refresh control pulse signal pulsing in the second refresh operation section in response to the refresh pulse signal and the first and second block control signals, and a third refresh control block controlling the first and second memory blocks to perform first and second refresh operations, respectively, in the first and second refresh operation sections in response to the first and second refresh control pulse signals.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

Figure 1:
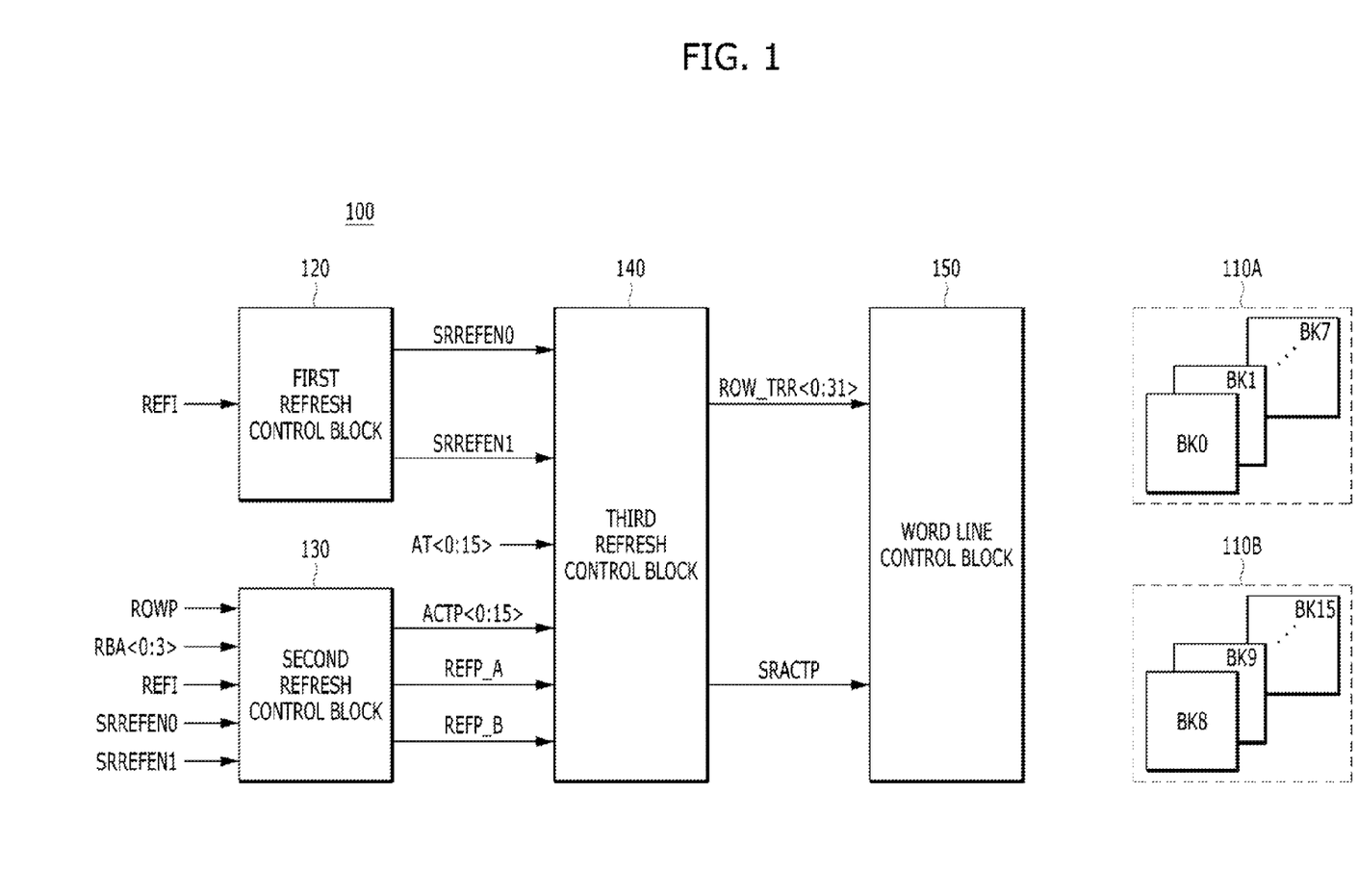
FIG. 1 is a block diagram illustrating a semiconductor device in accordance with an embodiment of the present invention.

It is also noted that in this specification, "connected/coupled" refers to one component not only directly coupling another component but also indirectly coupling another component through an intermediate component FIG. 1 is a block diagram illustrating a semiconductor device in accordance with an embodiment of the present invention.

Referring to FIG. 1, a semiconductor device 100 may include a first memory block 110A, a second memory block 110B, a first refresh control block 120, a second refresh control block 130, a third refresh control block 140, and a word line control block 150.

The first memory block 110A may include first to eighth memory units BK0 to BK7. For example, each of the first to eighth memory units BK0 to BK7 may include memory units that are organized in mats or banks. Hereinafter, the first to eighth memory units BK0 to BK7 are referred to as first to eighth banks BK0 to BK7.

The second memory block 110B may include ninth to $16^{th}$ memory units BK8 to BK15. For example, each of the ninth to $16^{th}$ memory units BK8 to BK15 may include a memory unit that is organized in mats or banks. Hereinafter, the ninth to $16^{th}$ memory units BK8 to BK15 are referred to as ninth to $16^{th}$ banks BK8 to BK15.

The first refresh control block 120 may generate a first block control signal SRREFEN0 and a second block control signal SRREFEN1 in response to a refresh pulse signal REFI. The first block control signal SRREFEN0 may be enabled in a first smart refresh operation section of the first memory block 110A, and the second block control signal SRREFEN1 may be enabled in a second smart refresh operation section of the second memory block 110B. The first and second smart refresh operation sections may be discontinuous. For example, the first refresh control block 120 may alternately enable the first block control signal SRREFEN0 and the second block control signal SRREFEN1 during a section corresponding to two cycles of the refresh pulse signal REFI whenever the refresh pulse signal REFI pulses 8N−1 times, where N is a natural number.

The second refresh control block 130 may generate a first refresh control pulse signal REFP_A corresponding to the first smart refresh operation section of the first memory block 110A and a second refresh control pulse signal REFP_B corresponding to the second smart refresh operation section of the second memory block 110B, in response to the refresh pulse signal REFI and the first and second block control signals SRREFEN0 and SRREFEN1. Also, the second refresh control block 130 may generate bank selection signals ACTP<0:15> for selecting the first to $16^{th}$ banks BK0 to BK15 in response to a row control signal ROWP and bank code signals RBA<0:3>.

The third refresh control block 140 may control the first and second memory blocks 110A and 110B in response to the first and second refresh control pulse signals REFP_A and REFP_B so that a smart refresh operation of the first memory block 110A and a smart refresh operation of the second memory block 110B are discontinuously performed. The smart refresh operation may include a process of enabling adjacent word lines of a target word line, which is detected in advance, corresponding to each of the first to $16^{th}$ banks BK0 to BK15.

The word line control block 150 may enable adjacent word lines of a predetermined target word line corresponding to each of the first to eighth banks BK0 to BK7 during the first smart refresh operation section and corresponding to each of the ninth to $16^{th}$ banks BK8 to BK15 during the second smart refresh operation section, in response to first to $32^{nd}$ neighboring addresses ROW_TRR<0:31> and a refresh combination pulse signal SRACTP.

Figure 2:
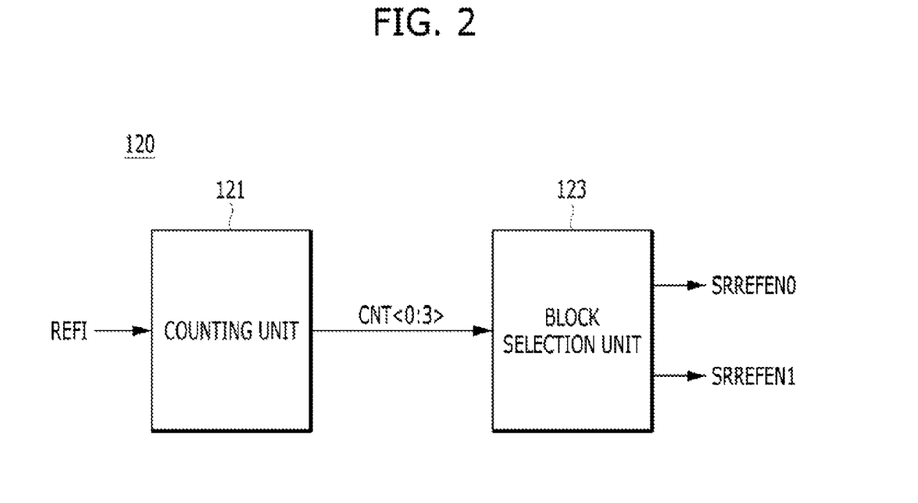
FIG. 2 is a block diagram illustrating a first refresh control block shown in FIG. 1.

FIG. 2 is a block diagram illustrating the first refresh control block 120 shown in FIG. 1.

Referring to FIG. 2, the first refresh control block 120 may include a counting unit 121 and a block selection unit 123. The counting unit 121 counts the number of times that the refresh pulse signal REFI pulses. The block selection unit 123 generates the first block control signal SRREFEN0 enabled during the first smart refresh operation section and the second block control signal SRREFEN1 enabled during the second smart refresh operation section, in response to counting signals CNT<0:3> generated from the counting unit 121.

For example, the counting unit 121 may count the number of times that the refresh pulse signal REFI pulses repeatedly from 1 to 16. The block selection unit 123 may enable the first block control signal SRREFEN0 when the number of times that the refresh pulse signal REFI pulses is 7 and 8 and the second block control signal SRREFEN1 when the number of times that the refresh pulse signal REFI pulses is 15 and 16. In other words, the block selection unit 123 may enable the first block control signal SRREFEN0 during the first smart refresh operation section corresponding to a seventh pulse and an eighth pulse of the refresh pulse signal REFI and the second block control signal SRREFEN1 during the second smart refresh operation section corresponding to a $15^{th}$ pulse and a $16^{th}$ pulse of the refresh pulse signal REFI.

Figure 3:
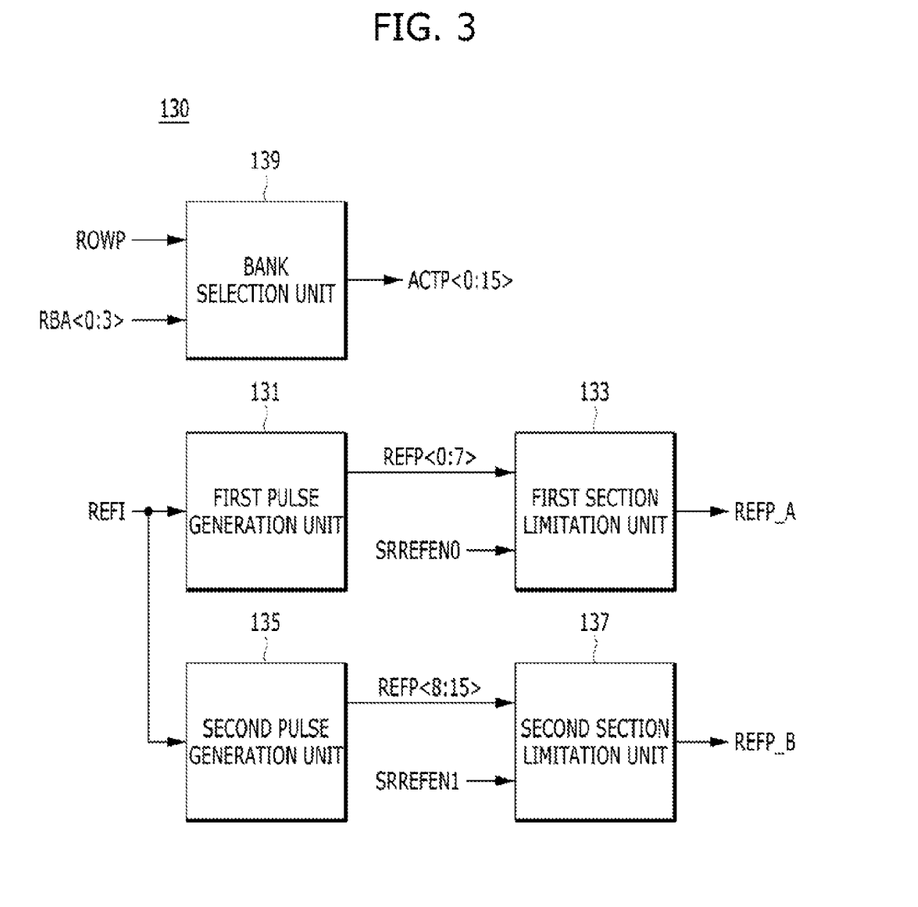
FIG. 3 is a block diagram illustrating a second refresh control block shown in FIG. 1.

FIG. 3 is a block diagram illustrating the second refresh control block 130 shown in FIG. 1.

Referring to FIG. 3, the second refresh control block 130 may include a first pulse generation unit 131, a first section limitation unit 133, a second pulse generation unit 135, a second section limitation unit 137, and a bank selection unit 139. The first pulse generation unit 131 generates first to eighth control pulse signals REFP<0:7> in response to the refresh pulse signal REFI. The first section limitation unit 133 generates the first refresh control pulse signal REFP_A in response to the first to eighth control pulse signals REFP<0:7> and the first block control signal SRREFEN0. The second pulse generation unit 135 generates ninth to $16^{th}$ control pulse signals REFP<8:15> in response to the refresh pulse signal REFI. The second section limitation unit 137 generates the second refresh control pulse signal REFP_B in response to the ninth to $16^{th}$ control pulse signals REFP<8:15> and the second block control signal SRREFEN1. The bank selection unit 139 generates the bank selection signals ACTP<0:15> for selecting the first to $16^{th}$ banks BK0 to BK15 in response to the row control signal ROWP and the bank code signals RBA<0:3>.

For example, the first pulse generation unit 131 may sequentially generate all the first to eighth control pulse signals REFP<0:7> whenever the refresh pulse signal REFI pulses, and the second pulse generation unit 135 may sequentially generate all the ninth to $16^{th}$ control pulse signals REFP<8:15> whenever the refresh pulse signal REFI pulses. The first section limitation unit 133 may output the first to eighth control pulse signals REFP<0:7> as the first refresh control pulse signal REFP_A only during the first smart refresh operation section where the first block control signal SRREFEN0 is enabled. The second section limitation unit 137 may output the ninth to $16^{th}$ control pulse signals REFP<8:15> as the second refresh control pulse signal REFP_B only during the second smart refresh operation section where the second block control signal SRREFEN1 is enabled. The bank selection unit 139 may generate the bank selection signals ACTP<0:15> by decoding the bank code signals RBA<0:3> only when the row control signal ROWP is enabled.

Figure 4:
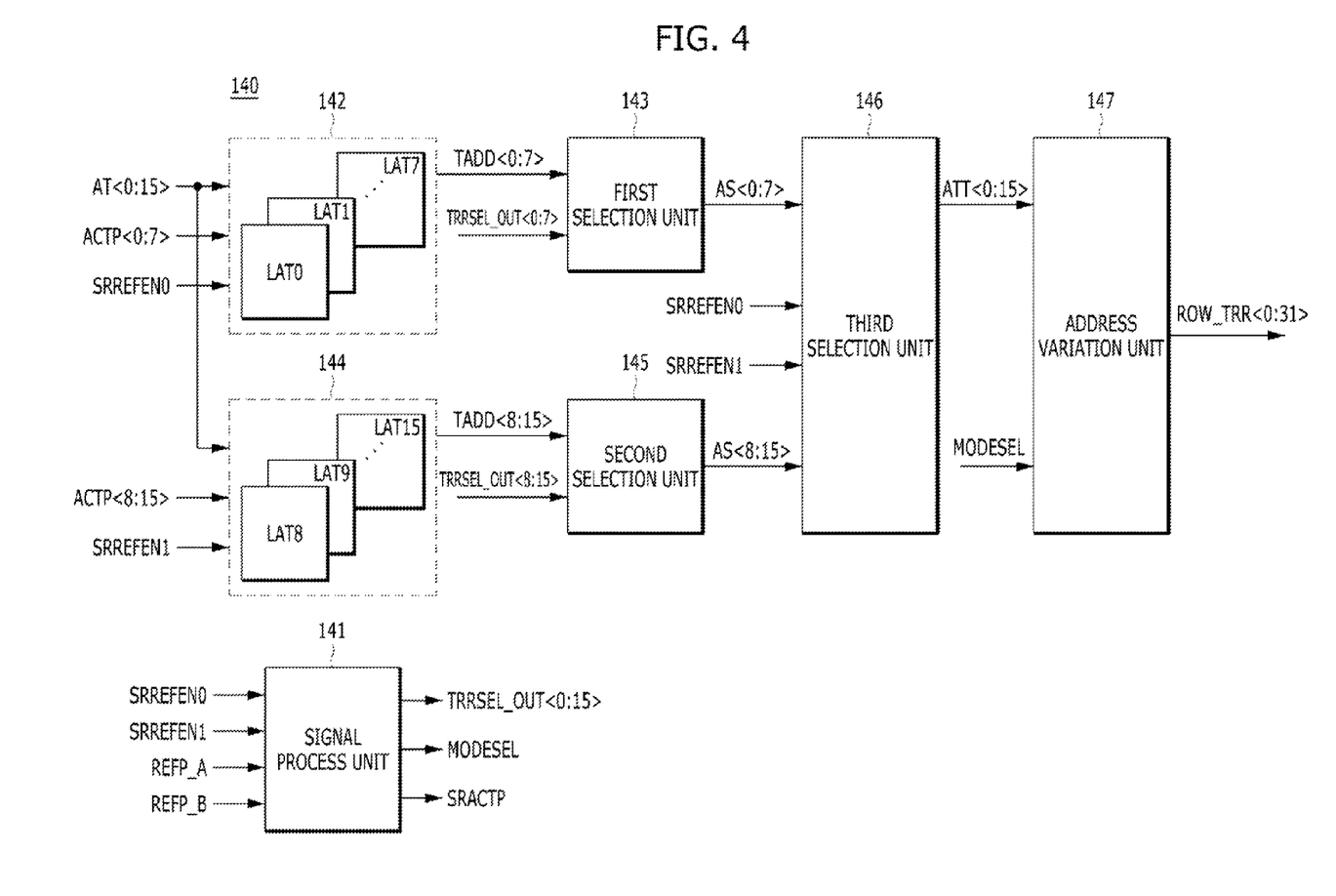
FIG. 4 is a block diagram illustrating a third refresh control block shown in FIG. 1.

FIG. 4 is a block diagram illustrating the third refresh control block 140 shown in FIG. 1.

Referring to FIG. 4, the third refresh control block 140 may include a signal process unit 141, a first address latch unit 142, a first selection unit 143, a second address latch unit 144, a second selection unit 145, a third selection unit 146, and an address variation unit 147.

The signal process unit 141 may generate first to $16^{th}$ address selection signals TRRSEL_OUT<0:15>, an address variation control signal MODESEL and the refresh combination pulse signal SRACTP in response to the first and second block control signals SRREFEN0 and SRREFEN1 and the first and second refresh control pulse signals REFP_A and REFP_B. For example, the signal process unit 141 may generate the first to eighth address selection signals TRRSEL_OUT<0:7>, which are sequentially enabled corresponding to the pulse of the first refresh control pulse signal REFP_A during the first smart refresh operation section where the first block control signal SRREFEN0 is enabled, and the ninth to $16^{th}$ address selection signals TRRSEL_OUT<8:15>, which are sequentially enabled corresponding to the pulse of the second refresh control pulse signal REFP_B during the second smart refresh operation section when the second block control signal SRREFEN1 is enabled.

The first address latch unit 142 may latch first to eighth target addresses AT<0:7> corresponding to the first to eighth banks BK0 to BK7 in response to the first bank selection signals ACTP<0:7> and the first block control signal SRREFEN0. For example, the first address latch unit 142 may sequentially latch the first to eighth target addresses AT<0:7> which are inputted in series in response to the first bank selection signals ACTP<0:7> and the first block control signal SRREFEN0.

The first selection unit 143 may sequentially select first to eighth latch addresses TADD<0:7> latched by the first address latch unit 142 in response to the first to eighth address selection signals TRRSEL_OUT<0:7>. For example, the first selection unit 143 may sequentially select the first to eighth latch addresses TADD<0:7> one by one in response to the first to eighth address selection signals TRRSEL_OUT<0:7> and output the selected addresses in series as first to eighth selection addresses AS<0:7>. Particularly, the first selection unit 143 may output the first to eighth selection addresses AS<0:7> two times during the first smart refresh operation section in response to the first to eighth address selection signals TRRSEL_OUT<0:7>.

The second address latch unit 144 may latch ninth to $16^{th}$ target addresses AT<8:15> corresponding to the ninth to $16^{th}$ banks BK8 to BK15 in response to the second bank selection signals ACTP<8:15> and the second block control signal SRREFEN1. For example, the second address latch unit 144 may sequentially latch the ninth to $16^{th}$ target addresses AT<8:15> which are inputted in series in response to the second bank selection signals ACTP<8:15> and the second block control signal SRREFEN1.

The second selection unit 145 may sequentially select ninth to $16^{th}$ latch addresses TADD<8:15> latched by the second address latch unit 144 in response to the ninth to $16^{th}$ address selection signals TRRSEL_OUT<8:15>. For example, the second selection unit 145 may sequentially select the ninth to $16^{th}$ latch addresses TADD<8:15> one by one in response to the ninth to $16^{th}$ address selection signals TRRSEL_OUT<8:15> and output the selected addresses in series as ninth to $16^{th}$ selection addresses AS<8:15>. Particularly, the second selection unit 145 may output the ninth to $16^{th}$ selection addresses AS<8:15> two times during the second smart refresh operation section in response to the ninth to $16^{th}$ address selection signals TRRSEL_OUT<8:15>.

The third selection unit 146 may sequentially select and output the first to eighth selection addresses AS<0:7> sequentially outputted from the first selection unit 143 and the ninth to $16^{th}$ selection addresses AS<8:15> sequentially outputted from the second selection unit 145 in response to the first and second block control signals SRREFEN0 and SRREFEN1. For example, the third selection unit 146 may select the first to eighth selection addresses AS<0:7> and output the selected addresses as first to eighth output addresses ATT<0:7> during the first smart refresh operation section where the first block control signal SRREFEN0 is enabled, and it may select the ninth to $16^{th}$ selection addresses AS<8:15> and output the selected addresses as ninth to $16^{th}$ output addresses ATT<8:15> during the second smart refresh operation section where the second block control signal SRREFEN1 is enabled. Particularly, the third selection unit 146 may output the first to eighth selection addresses AS<0:7>, which are inputted two times during the first smart refresh operation section, as the first to eighth output addresses ATT<0:7>, to the address variation unit 147 two times, and it may output the ninth to $16^{th}$ selection addresses AS<8:15>, which are inputted two times during the second refresh operation section, as the ninth to $16^{th}$ output addresses ATT<8:15>, to the address variation unit 147 two times.

The address variation unit 147 may generate the first to $32^{nd}$ neighboring addresses ROW_TRR<0:31> in response to the address variation control signal MODESEL and the first to $16^{th}$ output addresses ATT<0:15> sequentially outputted from the third selection unit 146. For example, the address variation unit 147 may generate the first to eighth neighboring addresses ROW_TRR<0:7> which are decreased from the first to eighth target addresses AT<0:7> and the ninth to $16^{th}$ neighboring addresses ROW_TRR<8:15> which are increased from the first to eighth target addresses AT<0:7>, in response to the first to eighth output addresses ATT<0:7> inputted two times during the first smart refresh operation section. The address variation unit 147 may generate the $17^{th}$ to $24^{th}$ neighboring addresses ROW_TRR<16:23>, which are decreased from the ninth to $16^{th}$ target addresses AT<8:15>, and the $25^{th}$ to $32^{nd}$ neighboring addresses ROW_TRR<24:31>, which are increased from the ninth to $16^{th}$ target addresses AT<8:15>, in response to the ninth to $16^{th}$ output addresses ATT<8:15> inputted two times during the second smart refresh operation section.

Hereinafter, a method for driving the semiconductor device 100 having the aforementioned structure in accordance with the embodiment of an present invention is described with reference to FIG. 5.

Figure 5:
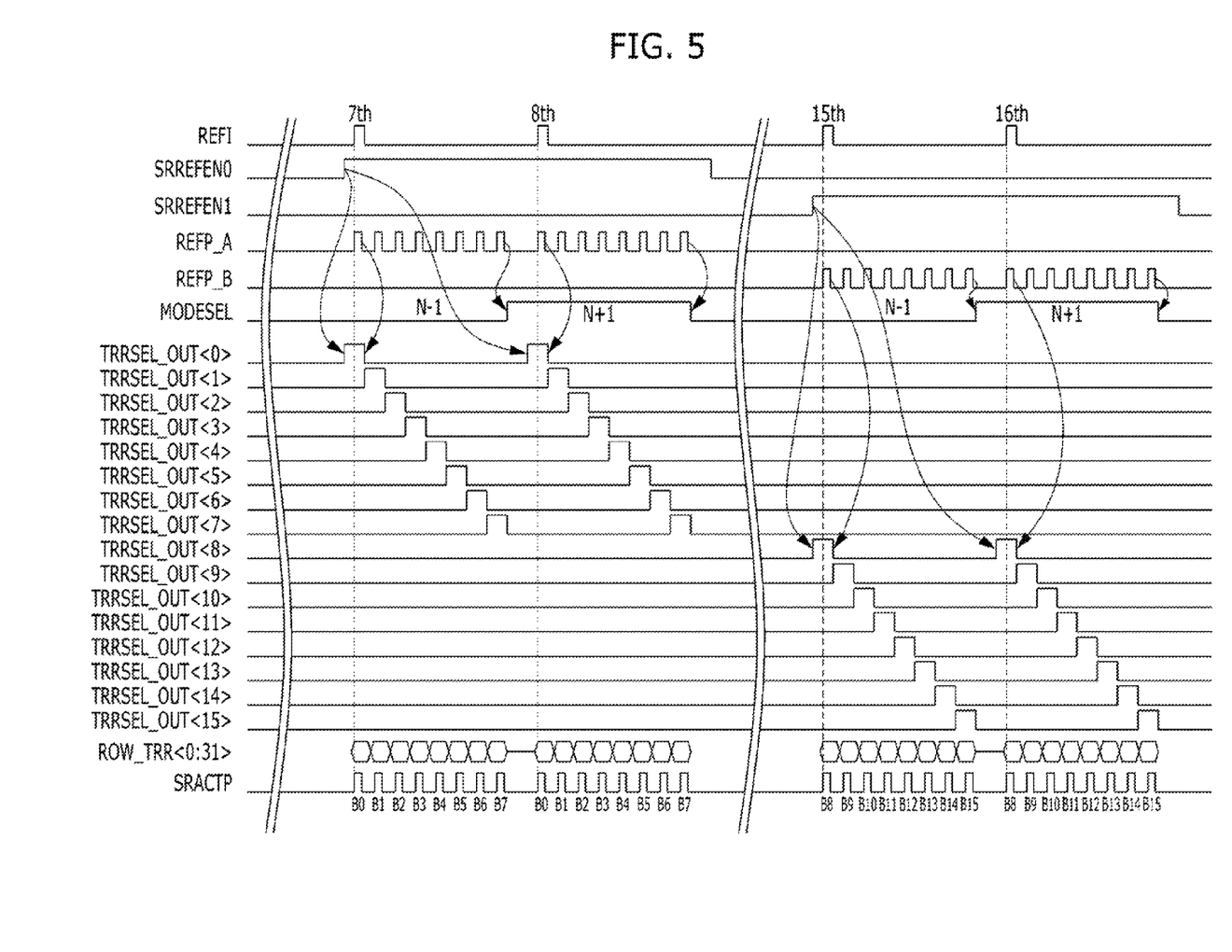
FIG. 5 is a timing diagram for describing a method for driving the semiconductor device shown in FIG. 1.

FIG. 5 is a timing diagram for describing a method for driving the semiconductor device 100 shown in FIG. 1.

Referring to FIG. 5, the method for driving the semiconductor device 100 may include performing a smart refresh operation of the first memory block 110A during a first smart refresh operation section that is subsequent to a first auto refresh operation section and performing a smart refresh operation of the second memory block 110B during a second smart refresh operation section that is subsequent to a second auto refresh operation section.

The first auto refresh operation section, the first smart refresh operation section, the second auto refresh operation section and the second smart refresh operation section may be defined based on the number of times that the refresh pulse signal REFI pulses. For example, the first auto refresh operation section may range from a first pulse (not shown in the drawing) of the refresh pulse signal REFI to a sixth pulse of the refresh pulse signal REFI (i.e., just before a seventh pulse of the refresh pulse signal REFI). The first smart refresh operation section may range from the seventh pulse of the refresh pulse signal REFI to an eighth pulse of the refresh pulse signal REFI (i.e., just before a ninth pulse (not shown in the drawing) of the refresh pulse signal REFI). The second auto refresh operation section may range from the ninth pulse of the refresh pulse signal REFI to a $14^{th}$ pulse of the refresh pulse signal REFI (i.e., just before a $15^{th}$ pulse of the refresh pulse signal REFI). The second smart refresh operation section may range from the $15^{th}$ pulse of the refresh pulse signal REFI to a $16^{th}$ pulse of the refresh pulse signal REFI (i.e., just before a $17^{th}$ pulse (not shown in the drawing) of the refresh pulse signal REFI).

To clearly and simply illustrate the concept of the present invention, only the first and second smart refresh operation sections are described hereafter.

The first smart refresh operation section will be described first.

During the first smart refresh operation section, the smart refresh operation of the first memory block 110A may be performed. The smart refresh operation of the first memory block 110A may include counting the number of times that the refresh pulse signal REFI pulses, generating the first to 16$^{th}$ neighboring addresses ROW_TRR<0:15> corresponding to the first to eighth target addresses AT<0:7> of the first memory block 110A when the number of times that the refresh pulse signal REFI pulses is counted is equal to the predetermined number of times, and enabling word lines corresponding to the first to 16$^{th}$ neighboring addresses ROW_TRR<0:15>.

In the counting of the number of times that the refresh pulse signal REFI pulses, the counting unit 121 may count the number of times that the refresh pulse signal REFI pulses, and the block selection unit 123 may generate the first block control signal SRREFEN0 that is enabled during the first smart refresh operation section based on a counting result of the counting unit 121. For example, when the number of times that the refresh pulse signal REFI pulses is '7' and '8', the block selection unit 123 may enable the first block control signal SRREFEN0 during the first smart refresh operation section.

In the generating of the first to 16$^{th}$ neighboring addresses ROW_TRR<0:15> corresponding to the first to eighth target addresses AT<0:7> of the first memory block 110A, the first pulse generation unit 131 may generate the first to eighth control pulse signals REFP<0:7> whenever the refresh pulse signal REFI pulses, and the first section limitation unit 133 may output the first to eighth control pulse signals REFP<0:7> as the first refresh control pulse signal REFP_A only during the first smart refresh operation section where the first block control signal SRREFEN0 is enabled, and the signal process unit 141 may generate the first to eighth address selection signals TRRSEL_OUT<0:7> and the address variation control signal MODESEL in response to the first block control signal SRREFEN0 and the first refresh control pulse signal REFP_A, and the first selection unit 143 may output the first to eighth selection addresses AS<0:7> corresponding to the first to eighth target addresses AT<0:7> during the first smart refresh operation section in response to the first to eighth address selection signals TRRSEL_OUT<0:7>, and the third selection unit 146 may output the first to eighth output addresses ATT<0:7> corresponding to the first to eighth selection addresses AS<0:7> during the first smart refresh operation section in response to the first block control signal SRREFEN0, and the address variation unit 147 may output the first to 16$^{th}$ neighboring addresses ROW_TRR<0:15> corresponding to the first to eighth output addresses ATT<0:7> in response to the address variation control signal MODESEL.

The signal process unit 141 may enable the first to eighth address selection signals TRRSEL_OUT<0:7> two times during the first smart refresh operation section and transition a logic level of the address variation control signal MODESEL one or more times during the first smart refresh operation section. The first selection unit 143 may read the first to eighth target addresses AT<0:7> two times and output the read addresses as the first to eighth selection addresses AS<0:7> two times during the first smart refresh operation section. The third selection unit 146 may output the first to eighth output addresses ATT<0:7> corresponding to the first to eighth selection addresses AS<0:7> two times during the first smart refresh operation section. The address variation unit 147 may sequentially output the first to eighth neighboring addresses ROW_TRR<0:7>, which are decreased from the first to eighth output addresses ATT<0:7>, in response to the address variation control signal MODESEL having a first logic level, and subsequently it may sequentially output the ninth to 16$^{th}$ neighboring addresses ROW_TRR<8:15>, which are increased from the first to eighth output addresses ATT<0:7>, in response to the address variation control signal MODESEL having a second logic level, during the first smart refresh operation section.

In the enabling of the word lines corresponding to the first to 16$^{th}$ neighboring addresses ROW_TRR<0:15>, the word line control block 150 may enable first word lines corresponding to the first to eighth neighboring addresses ROW_TRR<0:7>, and subsequently it may enable second word lines corresponding to the ninth to 16$^{th}$ neighboring addresses ROW_TRR<8:15> during the first smart refresh operation section. Accordingly, the smart refresh operation of the first memory block 110A may be performed.

The second smart refresh operation section will now be described.

During the second smart refresh operation section, the smart refresh operation of the second memory block 110b may be performed. The smart refresh operation of the second memory block 110b may include counting the number of times that the refresh pulse signal REFI pulses after the first memory block 110A's counting in the first smart refresh operation section, generating the 17$^{th}$ to 32$^{nd}$ neighboring addresses ROW_TRR<16:31> corresponding to the ninth to 16$^{th}$ target addresses AT<8:15> of the second memory block 110b when the number of times that the refresh pulse signal REFI pulses is counted the predetermined number of times, and enabling word lines corresponding to the 17$^{th}$ to 32$^{nd}$ neighboring addresses ROW_TRR<16:31>.

In the counting of the number of times that the refresh pulse signal REFI pulses, the counting unit 121 may continuously count the number of times that the refresh pulse signal REFI pulses, and the block selection unit 123 may generate the second block control signal SRREFEN1 that is enabled during the second smart refresh operation section based on a counting result of the counting unit 121. For example, when the number of times that the refresh pulse signal REFI pulses is '15' and '16', the block selection unit 123 may enable the second block control signal SRREFEN1 during the second smart refresh operation section.

In the generating of the 17$^{th}$ to 32$^{nd}$ neighboring addresses ROW_TRR<16:31> corresponding to the ninth to 16$^{th}$ target addresses AT<8:15> of the second memory block 110b, the second pulse generation unit 135 may generate the ninth to 16$^{th}$ control pulse signals REFP<8:15> whenever the refresh pulse signal REFI pulses, and the second section limitation unit 137 may output the ninth to 16$^{th}$ control pulse signals REFP<8:15> as the second refresh control pulse signal REFP_B only during the second smart refresh operation section where the second block control signal SRREFEN1 is enabled, and the signal process unit 141 may generate the ninth to 16$^{th}$ address selection signals TRRSEL_OUT<8:15> and the address variation control signal MODESEL in response to the second block control signal SRREFEN1 and the second refresh control pulse signal REFP_B, and the second selection unit 145 may output the ninth to 16$^{th}$ selection addresses AS<8:15> corresponding to the ninth to 16$^{th}$ target addresses AT<8:15> during the second smart refresh operation section in response to the ninth to 16$^{th}$ address selection signals TRRSEL_OUT<8:15>, and the third selection unit 146 may output the ninth to 16$^{th}$ output addresses ATT<8:15> corresponding to the ninth to 16$^{th}$ selection addresses AS<8:15> during the second smart refresh operation section in response to the second block control signal SRREFEN1, and the address variation unit 147 may output the $17^{th}$ to $32^{nd}$ neighboring addresses ROW_TRR<16:31> corresponding to the ninth to $16^{th}$ output addresses ATT<8:15> in response to the address variation control signal MODESEL.

The signal process unit 141 may enable the ninth to $16^{th}$ address selection signals TRRSEL_OUT<8:15> two times during the second smart refresh operation section and transition a logic level of the address variation control signal MODESEL one or more times during the second smart refresh operation section. The second selection unit 145 may read the ninth to $16^{th}$ target addresses AT<8:15> two times and output the read addresses as the ninth to $16^{th}$ selection addresses AS<8:15> two times during the second smart refresh operation section. The third selection unit 146 may output the ninth to $16^{th}$ output addresses ATT<8:15> corresponding to the ninth to $16^{th}$ selection addresses AS<8:15> two times during the second smart refresh operation section. The address variation unit 147 may sequentially output the $17^{th}$ to $24^{th}$ neighboring addresses ROW_TRR<16:23>, which are decreased from the ninth to $16^{th}$ output addresses ATT<8:15>, in response to the address variation control signal MODESEL having the first logic level, and subsequently it may sequentially output the $25^{th}$ to $32^{nd}$ neighboring addresses ROW_TRR<24:31>, which are increased from the ninth to $16^{th}$ output addresses ATT<8:15>, in response to the address variation control signal MODESEL having the second logic level, during the second smart refresh operation section.

In the enabling of the word lines corresponding to the $17^{th}$ to $32^{nd}$ neighboring addresses ROW_TRR<16:31>, the word line control block 150 may enable third word lines corresponding to the $17^{th}$ to $24^{th}$ neighboring addresses ROW_TRR<16:23>, and subsequently it may enable fourth word lines corresponding to the $25^{th}$ to $32^{nd}$ neighboring addresses ROW_TRR<24:31> during the second smart refresh operation section. Accordingly, the smart refresh operation of the second memory block 110b may be performed.

In accordance with the embodiments of the present invention, as the smart refresh operations are performed on the basis of memory blocks, the smart refresh operations of all the banks included therein may be completed within a limited refresh time although the number of the banks, i.e., the memory capacity, increases.

Since the refresh operations may be completed within the limited refresh time, the operational reliability of the semiconductor device may improve.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:

1. A semiconductor device, comprising:
a first memory block including a plurality of first memory units;
a second memory block including a plurality of second memory units;
a first refresh control block that generates a first block control signal corresponding to the first memory block and a second block control signal corresponding to the second memory block in response to a refresh pulse signal;
a second refresh control block that generates a first refresh control pulse signal corresponding to a first refresh operation section of the first memory block and a second refresh control pulse signal corresponding to a second refresh operation section of the second memory block in response to the refresh pulse signal and the first and second block control signals; and
a third refresh control block that controls the first and second memory blocks so that a first refresh operation of the first memory block and a second refresh operation of the second memory block are discontinuously performed in response to the first and second refresh control pulse signals,
wherein the second refresh operation of the second memory block starts after the first refresh operation of the first memory block is completed,
wherein the third refresh control block includes:
a signal process unit that generates first and second address selection signals, an address variation control signal and a refresh combination pulse signal in response to the first and second block control signals and the first and second refresh control pulse signals;
a first address latch unit that stores a plurality of first target addresses corresponding to the first memory units;
a first selection unit that sequentially selects the first target addresses as first selection addresses in response to the first address selection signal;
a second address latch unit that stores a plurality of second target addresses corresponding to the second memory units;
a second selection unit that sequentially selects the second target addresses as second selection addresses in response to the second address selection signal;
a third selection unit that sequentially outputs the first and second selection addresses as output addresses in response to the first and second block control signals; and
an address variation unit that generates a plurality of first and second neighboring addresses corresponding to the first target addresses and a plurality of third and fourth neighboring addresses corresponding to the second target addresses in response to the output addresses and the address variation control signal.

2. The semiconductor device of claim 1, wherein each of the first and second refresh operations includes a smart refresh operation.

3. The semiconductor device of claim 1, wherein the first refresh control block alternately enables the first and second block control signals whenever the refresh pulse signal pulses a predetermined number of times.

4. The semiconductor device of claim 1, wherein the first refresh control block includes:
a counting unit that counts a number of times that the refresh pulse signal pulses; and
a block selection unit that generates the first block control signal enabled during the first refresh operation section and the second block control signal enabled during the second refresh operation section in response to a counting signal generated from the counting unit.

5. The semiconductor device of claim 1, wherein the second refresh control block includes:
a first pulse generation unit that generates a plurality of first control pulse signals in response to the refresh pulse signal;

a first section limitation unit that generates the first refresh control pulse signal in response to the first control pulse signals and the first block control signal;

a second pulse generation unit that generates a plurality of second control pulse signals in response to the refresh pulse signal; and a second section limitation unit that generates the second refresh control pulse signal in response to the second control pulse signals and the second block control signal, wherein the first and second control pulse signals are sequentially enabled whenever the refresh pulse signal pulses.

6. The semiconductor device of claim 5, wherein the second refresh control block further includes:

a memory selection unit that generates a memory selection signal for selecting the first and second memory units in response to a row control signal and a memory code signal.

7. The semiconductor device of claim 1, wherein the first selection unit outputs the first selection addresses corresponding to the first target addresses two times during the first refresh operation section, and the second selection unit outputs the second selection addresses corresponding to the second target addresses two times during the second refresh operation section, and the third selection unit outputs the output addresses corresponding to the first and second selection addresses, respectively, during the first and second refresh operation sections.

8. The semiconductor device of claim 7, wherein the address variation unit generates the first neighboring addresses that are decreased from the first target addresses and the second neighboring addresses that are increased from the first target addresses in response to the output addresses inputted two times during the first refresh operation section, and generates the third neighboring addresses that are decreased from the second target addresses and the fourth neighboring addresses that are increased from the second target addresses in response to the output addresses inputted two times during the second refresh operation section.

9. A method for driving a semiconductor device, comprising:

performing a first smart refresh operation of a first memory block during a first smart refresh operation section subsequent to a first auto refresh operation section; and performing a second smart refresh operation of a second memory block during a second smart refresh operation section subsequent to a second auto refresh operation section, wherein the second smart refresh operation of the second memory block starts after the first smart refresh operation of the first memory block is completed, wherein the performing of the first smart refresh operation of the first memory block includes:

counting a number of times that the refresh pulse signal pulses;

generating first and second neighboring addresses corresponding to a first target address of the first memory block when the number of times that the refresh pulse signal pulses is equal to a first predetermined number; and enabling first and second word lines corresponding to the first and second neighboring addresses, wherein the generating of the first and second neighboring addresses includes:

reading the first target address, which is stored in advance, two times during the first smart refresh operation section; and generating the first neighboring address that is decreased from the first target address that is read first and the second neighboring address that is increased from the first target address that is read second.

10. The method of claim 9, wherein the first auto refresh operation section, the first smart refresh operation section, the second auto refresh operation section, and the second smart refresh operation section are defined based on a number of times that a refresh pulse signal pulses.

11. The method of claim 9, wherein the performing of the second smart refresh operation of the second memory block includes:

counting the number of times that the refresh pulse signal pulses;

generating third and fourth neighboring addresses corresponding to a second target address of the second memory block when the number of times that the refresh pulse signal pulses is counted is equal to a second predetermined number; and enabling third and fourth word lines corresponding to the third and fourth neighboring addresses.

12. The method of claim 11, wherein the generating of the third and fourth neighboring addresses includes:

reading the second target address, which is stored in advance, two times during the second smart refresh operation section; and generating the third neighboring address that is decreased from the second target address that is read first and the fourth neighboring address that is increased from the second target address that is read second.

* * * * *